United States Patent
Kwak et al.

(10) Patent No.: US 12,495,704 B2
(45) Date of Patent: Dec. 9, 2025

(54) ORGANIC LIGHT EMITTING DISPLAY DEVICE

(71) Applicant: LG Display Co., Ltd., Seoul (KR)

(72) Inventors: MooJin Kwak, Incheon (KR); Sinchul Kang, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 338 days.

(21) Appl. No.: 18/330,211

(22) Filed: Jun. 6, 2023

(65) Prior Publication Data
US 2023/0403911 A1  Dec. 14, 2023

(30) Foreign Application Priority Data

Jun. 10, 2022  (KR) .................. 10-2022-0070819

(51) Int. Cl.
*H10K 59/80* (2023.01)
*H10K 59/131* (2023.01)

(52) U.S. Cl.
CPC ....... *H10K 59/8731* (2023.02); *H10K 59/131* (2023.02)

(58) Field of Classification Search
CPC ................. H10K 50/8445; H10K 59/8731
USPC .......................................................... 313/512
See application file for complete search history.

(56) References Cited

U.S. PATENT DOCUMENTS

| | | | | |
|---|---|---|---|---|
| 7,109,655 B2 * | 9/2006 | Kurihara | ................ | H05B 33/04 |
| | | | | 313/504 |
| 7,700,958 B2 * | 4/2010 | Nishi | ................ | H10K 50/82 |
| | | | | 257/E23.126 |
| 7,928,656 B2 * | 4/2011 | Imamura | ................ | H10K 59/122 |
| | | | | 313/506 |
| 10,516,012 B2 * | 12/2019 | Ochi | ................ | H10K 59/124 |
| 2005/0040762 A1 * | 2/2005 | Kurihara | ................ | H10K 59/1213 |
| | | | | 313/504 |
| 2009/0029623 A1 * | 1/2009 | Son | ................ | H10K 50/8426 |
| | | | | 313/504 |
| 2018/0097200 A1 * | 4/2018 | Park | ................ | H10K 59/873 |
| 2019/0245161 A1 * | 8/2019 | Lee | ................ | H10K 59/8723 |
| 2022/0199691 A1 * | 6/2022 | Shin | ................ | H10K 50/865 |
| 2024/0276766 A1 * | 8/2024 | Kim | ................ | H10K 59/873 |
| 2024/0324413 A1 * | 9/2024 | Park | ................ | H10K 59/873 |
| 2025/0072208 A1 * | 2/2025 | Song | ................ | H10K 59/873 |
| 2025/0143143 A1 * | 5/2025 | Bang | ................ | H10K 59/8731 |
| 2025/0194381 A1 * | 6/2025 | Lee | ................ | H10K 59/873 |
| 2025/0221272 A1 * | 7/2025 | Lee | ................ | H10K 59/8731 |

FOREIGN PATENT DOCUMENTS

KR  102508330 B1 *  3/2023  ......... H10K 59/8731

* cited by examiner

*Primary Examiner* — Christopher M Raabe
(74) *Attorney, Agent, or Firm* — Seed Intellectual Property Law Group LLP

(57) ABSTRACT

Provided is an organic light emitting display device. The organic light emitting display device comprises a substrate including an active area and a non-active area enclosing the active area; a first inorganic encapsulation layer disposed in the active area and at least a part of the non-active area on the substrate; an organic encapsulation layer disposed on the first inorganic encapsulation layer; a second inorganic encapsulation layer disposed on the organic encapsulation layer; and a dam disposed between the first inorganic encapsulation layer and the second inorganic encapsulation layer in the non-active area. At least a part of the organic encapsulation layer is in contact with one surface of the dam.

19 Claims, 9 Drawing Sheets

ORGANIC LIGHT EMITTING DISPLAY DEVICE

CROSS-REFERENCE TO RELATED APPLICATIONS

This application claims the priority of Korean Patent Application No. 10-2022-0070819 filed on Jun. 10, 2022, in the Korean Intellectual Property Office, the disclosure of which is incorporated herein by reference.

BACKGROUND

Technical Field

The present disclosure relates to an organic light emitting display device, and more particularly, to an organic light emitting display device with a reduced bezel area.

Description of the Related Art

As an information age enters, the field of display devices for visually displaying electrical information signals is rapidly developing. Thus, studies for developing performances such as thinning, weight reduction, and low power consumption have continued.

Representative examples of the display devices include a liquid crystal display (LCD) device, an electro-wetting display (EWD) device, an organic light emitting display (OLED) device, and the like.

The non-active area of the display device is an area where an image is not displayed, therefore there is a demand to improve screen immersion and enhance a sense of beauty by increasing the size of an active area of the display device and decreasing the size of the non-active area of the display device.

BRIEF SUMMARY

An object to be achieved by the present disclosure is to provide an organic light emitting display device in which a non-active area corresponding to a bezel area is reduced.

Another object to be achieved by the present disclosure is to provide an organic light emitting display device in which the size of a non-active area is reduced while the reliability of an encapsulation unit is maintained.

Yet another object to be achieved by the present disclosure is to provide an organic light emitting display device in which the shape of an organic encapsulation layer may be easily controlled and display quality is improved.

Objects of the present disclosure are not limited to the above-mentioned objects, and other objects, which are not mentioned above, can be clearly understood by those skilled in the art from the following descriptions.

According to an aspect of the present disclosure, the organic light emitting display device includes a substrate including an active area and a non-active area enclosing the active area. Also, the organic light emitting display device includes a first inorganic encapsulation layer disposed in the active area and at least a part of the non-active area on the substrate. Further, the organic light emitting display device includes an organic encapsulation layer disposed on the first inorganic encapsulation layer. Furthermore, the organic light emitting display device includes a second inorganic encapsulation layer disposed on the organic encapsulation layer. Also, the organic light emitting display device includes a dam disposed between the first inorganic encapsulation layer and the second inorganic encapsulation layer in the non-active area. At least a part of the organic encapsulation layer is in contact with one surface of the dam. Therefore, the non-active area of the organic light emitting display device may be reduced.

Other detailed matters of the exemplary embodiments are included in the detailed description and the drawings.

According to the present disclosure, a dam of an organic light emitting display device is disposed inside an encapsulation unit. Thus, it is possible to reduce a non-active area.

Also, according to the present disclosure, the non-active area may be reduced and the shape of an organic encapsulation layer may be controlled.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
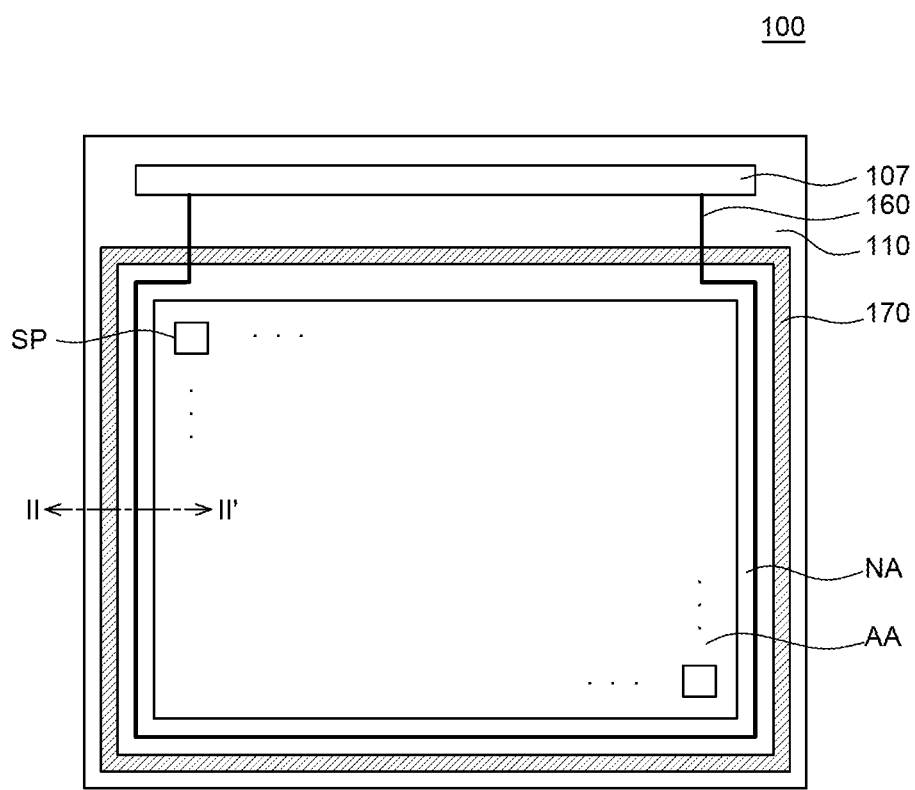
FIG. 1 is a schematic plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The term "between" used herein is used as being inclusive of the endpoints. For instance, "between X and Y" includes the end points X and Y.

The features of various embodiments of the present disclosure can be partially or entirely adhered to or combined with each other and can be interlocked and operated in technically various ways, and the embodiments can be carried out independently of or in association with each other.

Hereinafter, an organic light emitting display device according to exemplary embodiments of the present disclosure will be described in detail with reference to accompanying drawings.

Figure 2:
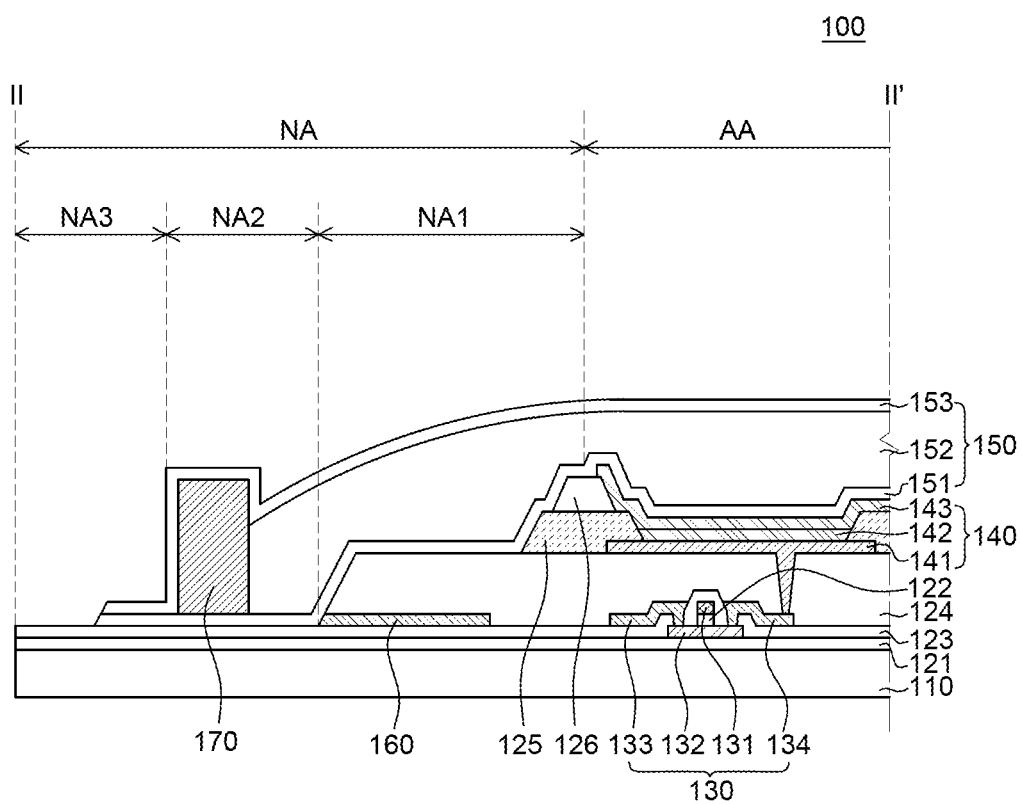
FIG. 2 is a cross-sectional view as taken along a line II-II' of FIG. 1.

FIG. 1 is a schematic plan view of an organic light emitting display device according to an exemplary embodiment of the present disclosure. FIG. 2 is a cross-sectional view as taken along a line II-II' of FIG. 1.

Referring to FIG. 1, an organic light emitting display device 100 according to an exemplary embodiment of the present disclosure may include a substrate 110, a pad unit 107, a common voltage line 160, and a dam 170.

The organic light emitting display device 100 is configured to display an image to a user.

In the organic light emitting display device 100, display elements for displaying an image and driving elements for driving the display elements may be disposed. Also, in the organic light emitting display device 100, lines for transmitting various signals to the display elements and the driving elements may be disposed. For example, the display elements of the organic light emitting display device 100 may be organic light emitting diodes each including an anode, an organic emission layer, and a cathode.

The organic light emitting display device 100 may include an active area AA and a non-active area NA. Since the substrate 110 is a base of the organic light emitting display device 100 and substantially has the same area as that of the organic light emitting display device 100, it can also be described that the substrate 110 may include the active area AA and the non-active area NA.

The active area AA is an area where an image is displayed in the display device 100.

A plurality of sub-pixels SP forming a plurality of pixels and a circuit for driving the plurality of sub-pixels SP may be disposed in the active area AA. The plurality of sub-pixels SP is a minimum unit of the active area AA, and a display element may be disposed on each of the plurality of sub-pixels SP. The plurality of sub-pixels SP may form a pixel. For example, an organic light emitting diode composed of an anode, an organic emission layer, and a cathode may be disposed on each of the plurality of sub-pixels SP. However, the present disclosure is not limited thereto. Also, the circuit for driving the plurality of sub-pixels SP may include a driving element and a line. For example, the circuit may be composed of a thin film transistor, a storage capacitor, a gate line, a data line, etc., but is not limited thereto.

The non-active area NA is an area where an image is not displayed.

Although FIG. 1 illustrates that the non-active area NA encloses the active area AA having a rectangular shape, the shape and arrangement of the active area AA and the non-active area NA are not limited to the example illustrated in FIG. 1.

In other words, the active area AA and the non-active area NA may have shapes suitable for a design of an electronic device equipped with the organic light emitting display device 100. For example, the active area AA may have a pentagonal shape, a hexagonal shape, a circular shape, an oval shape, and the like.

In the non-active area NA, various lines and circuits for driving the organic light emitting diodes in the active area AA may be disposed. For example, a link line for transmitting a signal to the plurality of sub-pixels SP and the circuit in the active area AA, a driver IC such as a gate driver IC or a data driver IC, or the pad unit 107 may be disposed in the non-active area NA. However, the present disclosure is not limited thereto.

The non-active area NA may include a first area, a second area, and a third area. Details thereof will be described later with reference to FIG. 2.

The organic light emitting display device 100 may include various additional components for generating various signals or driving the pixels in the active area AA. The additional components for driving the pixels may include an inverter circuit, a multiplexer, an electro static discharge (ESD) circuit, and the like. The organic light emitting display device 100 may also include components associated with functions other than the function to drive the pixels. For example, the organic light emitting display device 100 may include additional components for providing a touch sensing function, a user authentication function (e.g., finger print scanning), a multi-level pressure sensing function, a tactile feedback function, etc. The above-described additional components may be located in the non-active area NA and/or on an external circuit connected to a connection interface.

The pad unit 107 may be configured to receive a signal from the outside. The pad unit 107 may be disposed in the non-active area NA of the organic light emitting display device 100 and electrically connected to various lines and circuits disposed in the active area AA, and a printed circuit board. For example, the pad unit 107 may serve to transmit a signal to each of a gate line and a data line, and may be composed of a gate pad for transmitting a gate signal to the gate line and a data pad for transmitting a data signal to the data line. However, the present disclosure is not limited thereto.

The common voltage line 160 is formed outside the active area AA to surround the active area AA. The common voltage line 160 may supply a voltage to the organic light emitting diode in the active area AA. The common voltage line 160 will be described later in detail with reference to FIG. 2.

Meanwhile, the organic light emitting display device 100 according to an exemplary embodiment of the present disclosure may be provided with the dam 170 in the non-active area NA to secure reliability such as suppression of moisture permeation. As shown in FIG. 1, the dam 170 may be disposed on edges of the substrate 110 to surround the active area AA.

The dam 170 will be described later in more detail with reference to FIG. 2.

Each of the plurality of sub-pixels SP disposed in the active area AA may include a thin film transistor and an organic light emitting diode. The thin film transistors of the respective pixels are sequentially driven by the gate driver and the organic light emitting diodes emit light. Thus, an image is implemented.

Referring to FIG. 1 and FIG. 2, in the active area AA, a buffer layer 121 is formed on the substrate 110, and a thin film transistor 130 and an organic light emitting diode 140 are disposed on the buffer layer 121.

The substrate 110 may be flexible. Herein, the term "flexible" may encompass bendable, unbreakable, rollable, foldable, etc.

For example, the substrate 110 may be made of plastic. In this case, the substrate 110 may be referred to as a plastic film or a plastic substrate. For example, the substrate 110 may be made of a material selected from the group consisting of a polyester-based polymer, a silicon-based polymer, an acrylic polymer, a polyolefin-based polymer and a copolymer thereof. Specifically, the substrate 110 may be made of polyimide (PI). Polyimide (PI) is widely used for a plastic substrate because it may be applied to a high temperature process and may be coated.

When the substrate 110 is made of polyimide (PI), the organic light emitting display device may be manufactured with a glass support substrate disposed under the substrate 110. The support substrate may be released after the organic light emitting display device is completely manufactured. After the support substrate is released, a back plate may be disposed under the substrate 110 to support the substrate 110.

The buffer layer 121 is disposed on the substrate 110 to protect the thin film transistor 130 from impurities such as alkali ions that leak out of the substrate 110. For example, the buffer layer 121 may be a single layer or a multilayer of silicon nitride (SiNx) or silicon oxide (SiOx). Also, the buffer layer 121 may enhance the adhesion between the layers formed thereon and the substrate 110, and may block moisture or oxygen permeating through the substrate 110.

The common voltage line 160 is disposed on the buffer layer 121. The common voltage line 160 serves to apply a common voltage to the organic light emitting diode 140. The common voltage line 160 may be made of the same material as a source electrode 133 and a drain electrode 134 of the thin film transistor 130, or may be made of the same material as a gate electrode 131 of the thin film transistor 130.

The thin film transistor 130 may be formed on the buffer layer 121, and includes the gate electrode 131, an active layer 132, the source electrode 133 and the drain electrode 134. The thin film transistor 130 serves to switch the organic light emitting diode 140.

Specifically, the active layer 132 is formed on the buffer layer 121, and a gate insulating layer 122 is formed on the active layer 132 to insulate the active layer 132 from the gate electrode 131. The gate electrode 131 is formed on the gate insulating layer 122 to overlap the active layer 132. An interlayer insulating layer 123 is formed on the gate electrode 131 and the gate insulating layer 122. The source electrode 133 and the drain electrode 134 are formed on the interlayer insulating layer 123. The source electrode 133 and the drain electrode 134 are electrically connected to the active layer 132 through respective contact holes formed in the interlayer insulating layer 123. That is, the interlayer insulating layer 123 serves to insulate the gate electrode 131 from the source electrode 133 and the drain electrode 134 of the thin film transistor 130.

The active layer 132 may be made of polycrystalline silicon. In this case, a predetermined region of the active layer 132 may be doped with impurities. Also, the active layer 132 may be made of amorphous silicon, an organic semiconductor material, or an oxide.

Further, each of the gate insulating layer 122 and the interlayer insulating layer 123 may be made of an inorganic insulating material such as silicon oxide (SiOx) and silicon nitride (SiNx). Alternatively, each of the gate insulating layer 122 and the interlayer insulating layer 123 may be made of an organic insulating material.

Each of the gate electrode 131, the source electrode 133, and the drain electrode 134 may be made of a metal material. For example, it may be made of one of molybdenum (Mo), aluminum (Al), chromium (Cr), gold (Au), titanium (Ti), nickel (Ni), neodymium (Nd), copper (Cu), and a triple layer of titanium-aluminum-titanium (Ti—Al—Ti), or an alloy thereof. However, the present disclosure is not limited thereto. The source electrode 133 and the drain electrode 134 may include a material that may be etched by an etchant used when an anode 141 of the organic light emitting diode 140 is etched. Each of the gate electrode 131, the source electrode 133, and the drain electrode 134 may be a single layer or a multilayer made of the above-described materials.

Although the thin film transistor 130 has a coplanar structure in an exemplary embodiment of the present disclosure, the present disclosure is not limited thereto. Various thin film transistors may be employed by the organic light emitting display device 100.

A planarization layer 124 is disposed on the thin film transistor 130 and serves to planarize an upper part of the thin film transistor 130. The planarization layer 124 includes a contact hole for electrically connecting the thin film transistor 130 to the anode 141 of the organic light emitting diode 140. Specifically, the planarization layer 124 includes a contact hole for exposing either the source electrode 133 or the drain electrode 134 of the thin film transistor 130. The planarization layer 124 may be made of an organic insulating material. Although FIG. 2 illustrates the planarization layer 124 as a single layer, the planarization layer 124 may be formed as a double layer or a multilayer. That is, the planarization layer 124 may be changed to various forms.

Specifically, as shown in FIG. 2, the planarization layer 124 may be in direct contact with the source electrode 133 and the drain electrode 134 of the thin film transistor 130. That is, a separate passivation layer may not be disposed on the source electrode 133 and the drain electrode 134 of the thin film transistor 130. Instead, the planarization layer 124 may be disposed directly on the source electrode 133 and the drain electrode 134 of the thin film transistor 130. However, the present disclosure is not limited thereto.

The organic light emitting diode 140 is disposed on the planarization layer 124. The organic light emitting diode 140 includes the anode 141 on the planarization layer 124, an organic emission layer 142 on the anode 141, and a cathode 143 on the organic emission layer 142.

The anode 141 is disposed in the contact hole and on a part of the planarization layer 124 in each pixel, and is spaced apart from another anode. The anode 141 may supply holes to the organic emission layer 142 and may be made of a conductive material having a high work function. For example, the anode 141 may be made of a transparent conductive oxide (TCO) such as indium tin oxide (ITO).

If the organic light emitting display device 100 is a top emission organic light emitting display device, the anode 141 may be formed as a transparent conductive layer including a reflective layer having high reflectance at the bottom. However, the present disclosure is not limited thereto. That is, if the organic light emitting display device 100 has a top emission structure, the anode 141 may further include a reflective layer that reflects light upwardly. Although the reflective layer is described to be included in the anode 141 in an exemplary embodiment of the present disclosure, the reflective layer may also be defined as a separate component from the anode 141.

The organic emission layer 142 is made of an organic material for emitting light of a specific color. The organic emission layer 142 may be one of a red organic emission layer, a green organic emission layer, a blue organic emission layer and a white organic emission layer. If the organic emission layer 142 is implemented as the white organic emission layer, a color filter may be further disposed on an upper part of the organic light emitting diode 140.

The cathode 143 may supply electrons to the organic emission layer 142 and may be made of a conductive material having a low work function. If the organic light emitting display device 100 has a top emission structure, the cathode 143 may be implemented as a transparent conductive layer and may be made of a very thin metal material. However, the present disclosure is not limited thereto.

A bank layer 125 is disposed on the planarization layer 124 to cover a part of the anode 141 and isolates the pixel regions from one another in the active area AA. Also, the bank layer 125 may be made of an organic insulating material such as BCB (benzocyclobutene), an acrylic resin or an imide-based resin.

A spacer 126 is disposed on the bank layer 125. During a process of forming the organic emission layer 142 on the substrate 110 using a fine metal mask (FMM) as a deposition mask, the spacer 126 serves to suppress damage that may occur when the bank layer 125 comes in contact with the deposition mask. Also, the spacer 126 serves to maintain a predetermined gap between the bank layer 125 and the deposition mask. The spacer 126 may also be made of an organic insulating material or an inorganic insulating material.

An encapsulation unit 150 is disposed on the entire surface of the active area AA. The encapsulation unit 150 may protect the organic light emitting diode 140 from moisture permeating from the outside. The encapsulation unit 150 may be made of a transparent material so that light emitted from the organic light emitting diodes 140 may pass through it. The encapsulation unit 150 includes a first inorganic encapsulation layer 151, an organic encapsulation layer 152, and a second inorganic encapsulation layer 153.

The first inorganic encapsulation layer 151 and the second inorganic encapsulation layer 153 may be made of an inorganic material having transparency. For example, the inorganic material may include silicon nitride (SiNx), silicon oxide (SiOx), or aluminum oxide (AlxOy).

The first inorganic encapsulation layer 151 and the second inorganic encapsulation layer 153 may be disposed in the active area AA and at least a part of the non-active area NA on the substrate 110.

The organic encapsulation layer 152 is disposed between the first inorganic encapsulation layer 151 and the second inorganic encapsulation layer 153. The organic encapsulation layer 152 may be disposed on the first inorganic encapsulation layer 151 to cover particles caused by cracks. The cracks may occur during the process of forming the first inorganic encapsulation layer 151 or the second inorganic encapsulation layer 153. The organic encapsulation layer 152 may be made of a transparent organic material having flowability. For example, the transparent organic material may include an epoxy resin, an acryl resin, silicon oxygen carbon (SiOC), etc.

Referring to FIG. 2, the buffer layer 121, the interlayer insulating layer 123, and the encapsulation unit 150 on the substrate 110 may extend from the active area AA to the non-active area NA.

The non-active area NA is disposed to enclose the active area AA. Here, the non-active area NA may include a first area NA1, a second area NA2, and a third area NA3.

The first area NA1 may refer to an area ranging from the active area AA to an outermost periphery of the common voltage line 160. For example, the first area NA1 may be disposed between an outer end of the active area AA and an outer end of the planarization layer 124 when viewed from the top.

The second area NA2 may refer to an area ranging from the first area NA1 to a contact portion between the first inorganic encapsulation layer 151 and the second inorganic encapsulation layer 153. For example, the second area NA2 may be disposed between an outer end of the common voltage line 160 and an outer end of the organic encapsulation layer 152 when viewed from the top. That is, the second area NA2 may be disposed to overlap a part of the organic encapsulation layer 152.

The third area NA3 may refer to an area ranging from the second area NA2 to an outermost periphery of the substrate 110. For example, the third area NA3 may be disposed between an end of the organic encapsulation layer 152 and an end of the substrate 110 when viewed from the top. That is, the third area NA3 may not overlap the organic encapsulation layer 152.

The first area NA1, the second area NA2, and the third area NA3 may be different from each other in width. For example, the first area NA1 may have a width of 1450 μm to 1650 μm, the second area NA2 may have a width of 300 μm to 500 μm, and the third area NA3 may have a width of 400 μm to 600 μm.

The dam 170 may be disposed on the substrate 110. As shown in FIG. 1, the dam 170 is disposed in the non-active area NA on the edges of the substrate 110 to surround the active area AA. The dam 170 suppresses an overflow of the organic encapsulation layer 152 made of an organic material having high flowability. That is, the dam 170 may define an area where the organic encapsulation layer 152 of the encapsulation unit 150 is formed. Thus, the dam 170 may be formed to enclose the organic encapsulation layer 152 when viewed from the top.

The dam 170 is disposed between the first inorganic encapsulation layer 151 and the second inorganic encapsulation layer 153. The dam 170 as well as the organic encapsulation layer 152 may be encapsulated by the first inorganic encapsulation layer 151 and the second inorganic encapsulation layer 153. Thus, the dam 170 may be disposed to overlap the encapsulation unit 150. Specifically, the dam 170 may be disposed to overlap the organic encapsulation layer 152.

A lower surface of the dam 170 may be in contact with an upper surface of the first inorganic encapsulation layer 151, and at least a part of the organic encapsulation layer 152 may be in contact with one surface of the dam 170. For example, the dam 170 may be disposed to be in contact with an outer side surface of the organic encapsulation layer 152. Here, an outer side surface of the dam 170 that is not in contact with the outer side surface of the organic encapsulation layer 152 may be in contact with the second inorganic encapsulation layer 153. Also, the first inorganic encapsulation layer 151 extending from the outer side surface of the dam 170 to the outside of the substrate 110 may be in contact with the second inorganic encapsulation layer 153. That is, the dam 170 is disposed between the organic encapsulation layer 152 and the second inorganic encapsulation layer 153 when viewed from the side, and thus, it is possible to control the shape of the side surface of the organic encapsulation layer 152.

The dam 170 may be disposed in the second area NA2 of the non-active area NA. For example, the dam 170 may be disposed outside the common voltage line 160 so as not to overlap the planarization layer 124 disposed on the common voltage line 160.

A width of the dam 170 may be designed considering the width of the second area NA2 and the flowability of the organic encapsulation layer 152. For example, if the second area NA2 has a width of 400 µm, the dam 170 may have a width of 400 µm or less. Also, the dam 170 needs to have a predetermined width to control the shape of the organic encapsulation layer 152 and suppress the collapse caused by a load of the organic encapsulation layer 152. For example, the dam 170 may have a width of 100 µm to 200 µm.

A height of the dam 170 may be designed considering a step difference generated under the organic encapsulation layer 152. That is, the height of the dam 170 may be designed considering a step difference of the organic encapsulation layer 152 between the first area NA1 and the second area NA2. For example, if a step difference is generated by the planarization layer 124 and the bank layer 125 disposed under the organic encapsulation layer 152, the shape of the organic encapsulation layer 152 may be changed by the step difference. Thus, the height of the dam 170 may be designed considering the step difference generated under the organic encapsulation layer 152. For example, the dam 170 may have a height of 8 µm to 12 µm or 9 µm to 11 µm.

The dam 170 may be made of a material having a sufficient modulus to effectively control the flowability of the organic encapsulation layer 152 from the side surface of the organic encapsulation layer 152. For example, the dam 170 may be made of a material having a modulus of 2 GPa to 5 GPa or 3 GPa to 4 GPa.

The dam 170 may be made of a material having a low modulus to accommodate a stress that may be generated at an interface with the organic encapsulation layer 152 having flowability. For example, when an external impact is applied to the encapsulation unit 150, a stress may be generated between the dam 170 having rigidity and the organic encapsulation layer 152 having flowability. Thus, the dam 170 may be formed to have a low modulus to accommodate external impacts. Therefore, it is possible to suppress cracks and delamination of the encapsulation unit 150.

Meanwhile, the dam 170 may be made of a material having a sufficient modulus to control the flowability of the organic encapsulation layer 152. For example, if the dam is made of a material having a low modulus, the dam as well as the organic encapsulation layer may increase in flowability, which makes it difficult to control the shape of the organic encapsulation layer. Thus, an overflow of the organic encapsulation layer may occur. Therefore, the dam 170 may be formed to have a sufficient modulus to effective control the shape of the organic encapsulation layer 152.

Accordingly, the dam 170 may be made of a material having a modulus including 300 MPa for the organic encapsulation layer 152 and a conventional modulus range of 6 GPa to 7 GPa for the dam. This is to control the shape of the organic encapsulation layer 152 and alleviate a stress simultaneously. For example, the dam 170 may be made of a material having a modulus of 3 GPa to 4 GPa. The modulus of the dam 170 may be regulated by the ratio of a copolymer.

The dam 170 may be formed by an initiated chemical vapor deposition (iCVD) method so as to be formed as a uniform polymer film. The iCVD method refers to a process of forming a polymer film by vapor deposition in a vacuum chamber. According to the iCVD method, an initiator forms radicals and a monomer is vaporized at a high temperature to deposit a polymer. The method of forming the dam 170 will be described later in more detail with reference to FIG. 5A through FIG. 5E.

When an organic layer of the organic light emitting diode is exposed to moisture or oxygen, its properties are rapidly degraded. Therefore, it is important to suppress degradation of the organic light emitting diode, which may be caused by permeation of moisture and oxygen, by sealing the organic light emitting diode from the external environment.

Accordingly, the encapsulation unit blocks a permeation path of external moisture and oxygen to protect the organic light emitting diode from the external moisture and oxygen. In this case, the organic encapsulation layer may be made of an organic material having flowability to cover particles caused by cracks. The cracks may occur during the process of forming the first inorganic encapsulation layer or the second inorganic encapsulation layer. Meanwhile, the organic encapsulation layer has lower anti-moisture permeation ability than the first inorganic encapsulation layer and the second inorganic encapsulation layer. Thus, the organic encapsulation layer needs to be sealed by the first inorganic encapsulation layer and the second inorganic encapsulation layer. Also, the shape of the organic encapsulation layer needs to be controlled for effective sealing. Therefore, the dam is disposed outside the encapsulation unit to control the shape of the organic encapsulation layer. The shape of the organic encapsulation layer may vary depending on the width of the dam. Also, it is important to increase the width of the dam in order to enhance the function of suppressing an overflow of the organic encapsulation layer during manufacturing of the display device.

Meanwhile, in a conventional organic light emitting display device, the dam is a separate component from the encapsulation unit. Specifically, the dam is disposed outside the organic encapsulation layer and under the first inorganic encapsulation layer and the second inorganic encapsulation layer. Thus, the dam is disposed in the non-active area. If the dam needs to have a predetermined size or more in order to control the shape of the organic encapsulation layer, the non-active area increases in size, which limits a reduction in bezel of the organic light emitting display device.

Therefore, in the organic light emitting display device 100 according to an exemplary embodiment of the present disclosure, the dam 170 may be disposed inside the encapsulation unit 150 to reduce the size of the non-active area NA. specifically, the dam 170 may be disposed in the second area NA2 to overlap the organic encapsulation layer 152 and thus may reduce the size of the third area NA3. Conventionally, the third area needs a non-active area of 470 μm where the dam for controlling the shape of the organic encapsulation layer is disposed. However, in the organic light emitting display device 100 according to an exemplary embodiment of the present disclosure, the dam 170 is disposed inside the encapsulation unit 150, and thus, a separate area for the dam 170 is not needed. Therefore, the non-active area NA may be reduced in size by 470 μm from each side of the organic light emitting display device 100. That is, the size of the active area AA may be increased that much. The active area AA may be increased in size by 470 μm from each side of the organic light emitting display device 100 compared to an organic light emitting display device having the same size.

Meanwhile, in the organic light emitting display device 100 according to an exemplary embodiment of the present disclosure, the size of the non-active area NA is reduced while the reliability of the encapsulation unit 150 is maintained. If the dam 170 is disposed inside the encapsulation unit 150, the size of the non-active area NA outside the organic encapsulation layer 152 is reduced. Even in this case, the dam 170 may maintain its width constant to control the shape of the organic encapsulation layer 152. That is, while the size of the non-active area NA is reduced, it is possible to achieve the same functional effect of controlling the shape of the organic encapsulation layer 152. Therefore, the reliability of the encapsulation unit 150 may be maintained by reducing only the size of the third area NA3 without reducing the width of the dam 170.

Figure 3:
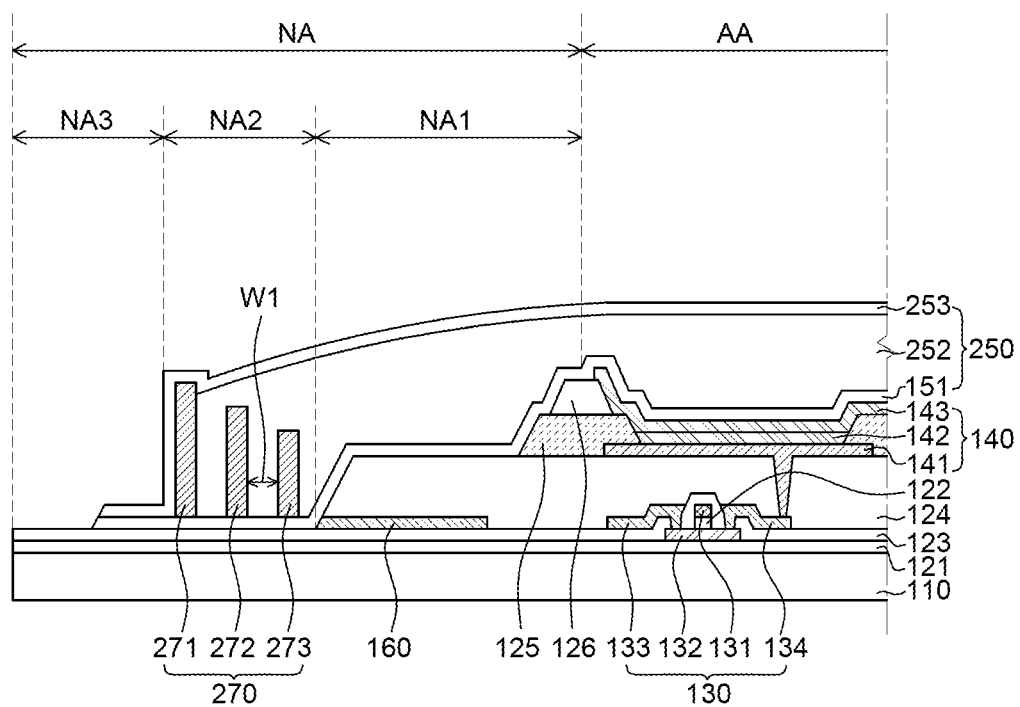
FIG. 3 is a cross-sectional view of an organic light emitting display device according to another exemplary embodiment of the present disclosure.

FIG. 3 is a cross-sectional view of an organic light emitting display device according to another exemplary embodiment of the present disclosure.

A display device 200 according to another exemplary embodiment of the present disclosure as shown in FIG. 3 is substantially the same as the display device 100 according to an exemplary embodiment of the present disclosure as shown in FIG. 1 and FIG. 2 except the configuration of an encapsulation unit 250 and a dam 270. Therefore, a repeated description thereof will be omitted. The same reference numerals denote the same components. Hereinafter, a repeated description of the same reference numerals will be omitted.

Referring to FIG. 3, the dam 270 is disposed in the non-active area NA on the edges of the substrate 110 to surround the active area AA. Also, the dam 270 may be disposed to enclose an organic encapsulation layer 252.

The dam 270 is disposed between the first inorganic encapsulation layer 151 and a second inorganic encapsulation layer 253. Thus, the dam 270 may be disposed to overlap the encapsulation unit 250. Specifically, the dam 270 may be disposed to overlap the organic encapsulation layer 252.

The dam 270 may be disposed in the second area NA2 of the non-active area NA. For example, the dam 270 may be disposed outside the common voltage line 160.

Referring to FIG. 3, the dam 270 may be composed of a plurality of dams. For example, the dam 270 may include a first sub-dam 271, a second sub-dam 272, and a third sub-dam 273.

The first sub-dam 271 is disposed close to an outer peripheral portion of the substrate 110. The second sub-dam 272 is spaced apart from the first sub-dam 271, and disposed closer to the active area AA of the substrate 110 than the first sub-dam 271. The third sub-dam 273 is spaced apart from the second sub-dam 272, and disposed closer to the active area AA of the substrate 110 than the second sub-dam 272.

The first sub-dam 271 of the dams 270 may be disposed to enclose the organic encapsulation layer 252 and may be in contact with an outer side surface of the organic encapsulation layer 252. Also, an outer side surface of the first sub-dam 271 may be in contact with the second inorganic encapsulation layer 253. Also, the first inorganic encapsulation layer 151 extending from the outer side surface of the first sub-dam 271 to the outside of the substrate 110 may be in contact with the second inorganic encapsulation layer 253. That is, the first sub-dam 271 may suppress an overflow of the organic encapsulation layer 252.

The second sub-dam 272 and the third sub-dam 273 of the dams 270 are disposed between the first sub-dam 271 and the common voltage line 160 to overlap the organic encapsulation layer 252. For example, the second sub-dam 272 and the third sub-dam 273 may be disposed under the organic encapsulation layer 252.

As a plurality of sub-dams is disposed closer to an outer side surface of the substrate 110, the plurality of sub-dams may increase in height. That is, the first sub-dam 271 may have a greater height than the second sub-dam 272 and the third sub-dam 273. Thus, the first sub-dam 271 may be disposed to further protrude than the second sub-dam 272 and the third sub-dam 273. For example, the first sub-dam 271 may have a height of 9 μm to 11 μm, and the second sub-dam 272 and the third sub-dam 273 may have a height of 8 μm to 11 μm.

A spacing distance W1 between every two adjacent sub-dams of the plurality of sub-dams may be designed considering the width of the second area NA2 and the number sub-dams. For example, if the second area NA2 has a width of 400 μm and the dam 270 is composed of two dams, the plurality of dams 270 may be spaced apart from each other at a distance of 80 μm to 120 μm. If the dam 270 is composed of three dams, the plurality of sub-dams may be spaced apart from one another at a distance of 130 μm to 170 μm. Thus, the spacing distance W1 between the plurality of sub-dams may be from 80 μm to 170 μm.

The spacing distance W1 between the plurality of sub-dams may vary. For example, if the plurality of sub-dams increases in height as being closer to the outer side surface of the substrate 110, the plurality of sub-dams may increase in spacing distance. Specifically, as shown in FIG. 3, the first sub-dam 271 may have a greater height than the second sub-dam 272 and the third sub-dam 273, and the second sub-dam 272 may have a greater height than the third sub-dam 273. In this case, a spacing distance between the first sub-dam 271 and the second sub-dam 272 may be greater than a spacing distance between the second sub-dam 272 and the third sub-dam 273.

Also, each of the plurality of sub-dams may have a different width. For example, the plurality of sub-dams may be disposed to gradually increase or decrease in height as being closer to the outer side surface of the substrate 110. Further, at least one of the plurality of sub-dams may have a different width. For example, an intermediate dam disposed in the middle among the plurality of sub-dams may have a greater width than an inner or outer dam.

The width of each of the plurality of sub-dams may be designed considering the width of the second area NA2 and the number of sub-dams. For example, if the second area NA2 has a width of 400 μm and the dam 270 is composed of two dams, each of the plurality of sub-dams may have a width of 50 μm to 100 μm. If the dam 270 is composed of three dams, each of the plurality of sub-dams may have a width of 25 μm to 50 μm.

The dam 270 may be made of a material having a sufficient modulus to effectively control the flowability of the organic encapsulation layer 252 from the side surface of the organic encapsulation layer 252. For example, the dam 270 may be made of a material having a modulus of 3 GPa to 4 GPa.

Here, the second sub-dam 272 and the third sub-dam 273 may be made of the same material as the first sub-dam 271, and may be formed simultaneously when the first sub-dam 271 is formed. For example, the plurality of sub-dams may be formed by patterning a polymer layer integrally formed on the first inorganic encapsulation layer 151 by the iCVD method.

Although the plurality of sub-dams is illustrated as including the first sub-dam 271, the second sub-dam 272, and the third sub-dam 273, the number of sub-dams is not limited thereto.

The encapsulation unit 250 is disposed on the entire surface of the active area AA. The encapsulation unit 250 includes the first inorganic encapsulation layer 151, the organic encapsulation layer 252, and the second inorganic encapsulation layer 253.

The first inorganic encapsulation layer 151 and the second inorganic encapsulation layer 253 may be made of an inorganic material having transparency.

The organic encapsulation layer 252 is disposed between the first inorganic encapsulation layer 151 and the second inorganic encapsulation layer 253. The organic encapsulation layer 252 may cover particles caused by cracks. The cracks may occur during the process of forming the first inorganic encapsulation layer 151 or the second inorganic encapsulation layer 253.

The organic encapsulation layer 252 may be disposed to overlap the plurality of sub-dams, and may be disposed between the plurality of sub-dams. That is, the organic encapsulation layer 252 may fill in between the plurality of sub-dams. Thus, the organic encapsulation layer 252 may have an uneven lower surface patterned according to the shape of the dam 270. In this case, the organic encapsulation layer 252 may be disposed to cover an upper surface of the dam 270 close to the active area AA. That is, the organic encapsulation layer 252 may be disposed to cover upper surfaces of the second sub-dam 272 and the third sub-dam 273 among the plurality of sub-dams.

As described above, in the display device 200 according to another exemplary embodiment of the present disclosure, the dam 270 is disposed inside the encapsulation unit 250 to overlap the organic encapsulation layer 252. Thus, it is possible to reduce the size of the non-active area NA.

Also, in the display device 200 according to another exemplary embodiment of the present disclosure, even if the size of the non-active area NA outside the organic encapsulation layer 252 is reduced, the dam 270 for controlling the shape of the organic encapsulation layer 252 may maintain its width constant. Therefore, the reliability of the encapsulation unit 250 may be maintained.

Further, in the display device 200 according to another exemplary embodiment of the present disclosure, the dam 270 disposed inside the encapsulation unit 250 is composed of a plurality of sub-dams. Thus, it is possible to effectively control the flowability of the organic encapsulation layer 252. A material having high flowability may maintain its shape by means of surface tension. The surface tension may be improved by increasing a contact surface at the interface of the material. Thus, in the display device 200 according to another exemplary embodiment of the present disclosure, the dam 270 is composed of the first sub-dam 271, the second sub-dam 272, and the third sub-dam 273. The first sub-dam 271 suppresses an overflow of the organic encapsulation layer 252 from the side surface of the organic encapsulation layer 252, and the second sub-dam 272 and the third sub-dam 273 are disposed under the organic encapsulation layer 252. Since the organic encapsulation layer 252 is disposed to fill in between the plurality of sub-dams, a contact surface between the dam 270 and the organic encapsulation layer 252 may be increased. That is, the surface area of the organic encapsulation layer 252 is increased and the surface tension of the organic encapsulation layer 252 is improved compared to a case where a single dam is disposed under the organic encapsulation layer 252. Therefore, it may become easier to control the flowability of the organic encapsulation layer 252.

Figure 4:
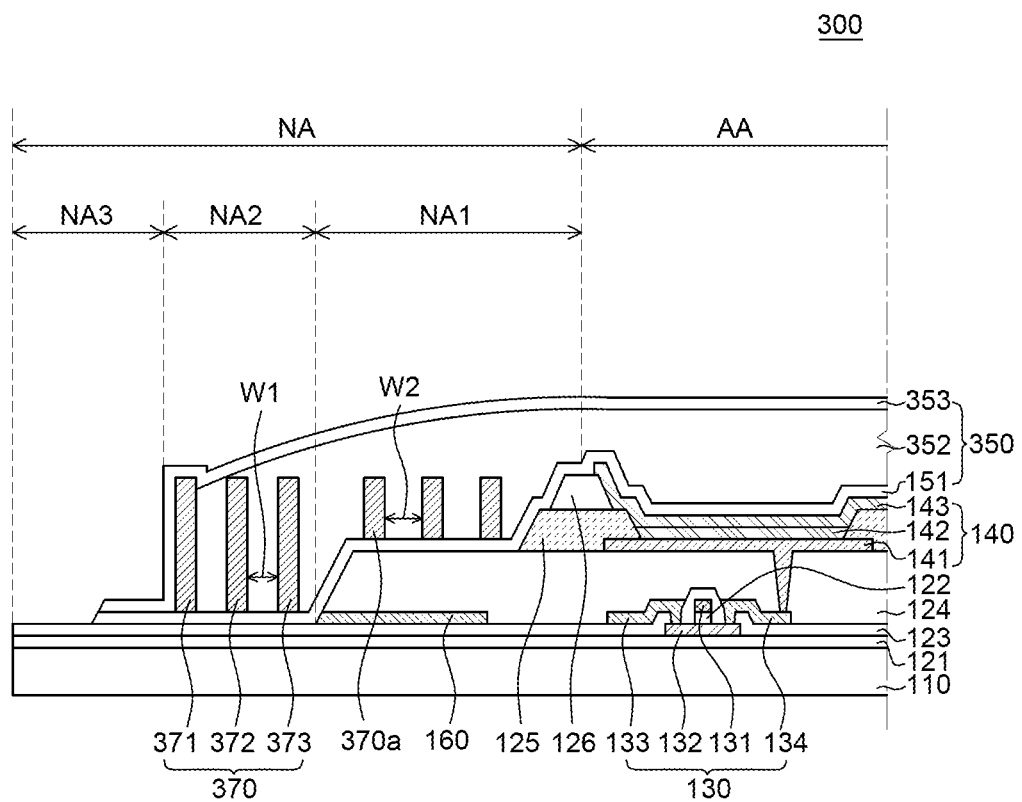
FIG. 4 is a cross-sectional view of an organic light emitting display device according to yet another exemplary embodiment of the present disclosure.

FIG. 4 is a cross-sectional view of an organic light emitting display device according to yet another exemplary embodiment of the present disclosure.

A display device 300 according to yet another exemplary embodiment of the present disclosure as shown in FIG. 4 is substantially the same as the display device 200 according to another exemplary embodiment of the present disclosure as shown in FIG. 3 except the configuration of a dam 370 (which may be referred to as a main dam in this embodiment) and an encapsulation unit 350 and the addition of an auxiliary dam 370a. Therefore, a repeated description thereof will be omitted. The same reference numerals denote the same components. Hereinafter, a repeated description of the same reference numerals will be omitted.

The dam 370 is disposed in the non-active area NA on the edges of the substrate 110 to surround the active area AA. Also, the dam 370 may be disposed to enclose an organic encapsulation layer 352.

The dam 370 is disposed between the first inorganic encapsulation layer 151 and a second inorganic encapsulation layer 353. Thus, the dam 370 may be disposed to overlap the encapsulation unit 350. Specifically, the dam 370 may be disposed to overlap the organic encapsulation layer 352.

The dam 370 may be disposed in the second area NA2 of the non-active area NA. For example, the dam 370 may be disposed outside the common voltage line 160.

Referring to FIG. 4, the dam 370 may include a plurality of sub-dams (which may be referred to as main sub-dams). The dam 370 may include a first sub-dam 371, a second sub-dam 372, and a third sub-dam 373.

The first sub-dam 371 is disposed close to the outer peripheral portion of the substrate 110. The second sub-dam 372 is spaced apart from the first sub-dam 371, and disposed closer to the active area AA of the substrate 110 than the first sub-dam 371. The third sub-dam 373 is spaced apart from the second sub-dam 372, disposed closer to the active area AA of the substrate 110 than the second sub-dam 372.

The first sub-dam 371 of the dam 370 may be disposed to enclose the organic encapsulation layer 352 and may be in contact with an outer side surface of the organic encapsulation layer 352. Also, an outer side surface of the first sub-dam 371 may be in contact with the second inorganic encapsulation layer 353. Also, the first inorganic encapsulation layer 151 extending from the outer side surface of the first sub-dam 371 to the outside of the substrate 110 may be in contact with the second inorganic encapsulation layer 353.

The second sub-dam 372 and the third sub-dam 373 of the dam 370 are disposed between the first sub-dam 371 and the common voltage line 160 to overlap the organic encapsulation layer 352. For example, the second sub-dam 372 and the third sub-dam 373 may be disposed under the organic encapsulation layer 352.

As a plurality of sub-dams may have the same height. For example, the dam 370 may have a height of 9 μm to 11 μm. Thus, upper surfaces of the plurality of sub-dams may be disposed on the same plane.

The spacing distance W1 between every two adjacent sub-dams of the plurality of sub-dams and the width of each sub-dam may be designed considering the width of the second area NA2 and the number of dams 370. For example, the spacing distance W1 between the plurality of sub-dams may be from 80 μm to 170 μm.

The dam 370 may be made of a material having a sufficient modulus to effectively control the flowability of the organic encapsulation layer 352.

The plurality of sub-dams may be made of the same material at the same time.

The auxiliary dam 370a is disposed in the non-active area NA on the edges of the substrate 110 to surround the active area AA. In this case, the auxiliary dam 370a is disposed inside the dam. The auxiliary dam 370a may be disposed to overlap the organic encapsulation layer 352 when viewed from the top and may serve to control the shape of the organic encapsulation layer 352.

The auxiliary dam 370a is disposed between the first inorganic encapsulation layer 151 and the second inorganic encapsulation layer 353. Thus, the auxiliary dam 370a may be disposed to overlap the encapsulation unit 350. Specifically, the auxiliary dam 370a may be disposed to overlap the organic encapsulation layer 352. Thus, a lower surface of the auxiliary dam 370a may be in contact with the upper surface of the first inorganic encapsulation layer 151. Also, the other surfaces of the auxiliary dam 370a except the lower surface may be in contact with the organic encapsulation layer 352.

The auxiliary dam 370a may be disposed in the first area NA1 of the non-active area NA. That is, the auxiliary dam 370a may be disposed closer to the active area AA than the second area NA2 where dam 370 is disposed. For example, the auxiliary dam 370a may be disposed on the planarization layer 124 of the substrate 110 so as to overlap the encapsulation unit 350. Specifically, the auxiliary dam 370a may be disposed to overlap the organic encapsulation layer 352.

The auxiliary dam 370a may be composed of a plurality of auxiliary sub-dams. Specifically, the auxiliary dam 370a may include an auxiliary sub-dam disposed close to the first sub-dam 371, an auxiliary sub-dam disposed close to the active area AA of the substrate 110, and an auxiliary sub-dam disposed between the two auxiliary sub-dams.

The auxiliary dam 370a is disposed under the organic encapsulation layer 352 to effectively control the shape of the organic encapsulation layer 352.

The plurality of auxiliary sub-dams may have the same height. For example, the auxiliary dam 370a may have a height of 7 μm to 8 μm. Under the organic encapsulation layer 352, a step difference may be generated by various insulating layers disposed on the common voltage line 160. The dam 370 and the auxiliary dam 370a may have different heights from each other to compensate for the step difference. For example, the auxiliary dam 370a may be designed to have a lower height than the dam 370. That is, a difference in height between the dam 370 and the auxiliary dam 370a may be equivalent to the height of various insulating layers disposed on the common voltage line 160. However, the organic encapsulation layer 352 may decrease in thickness as being closer to the outer side surface of the substrate 110. Therefore, upper surfaces of the plurality of auxiliary sub-dams may be disposed lower than an upper surface of the dam 370. For example, the dam 370 may have a height of 9 μm to 11 μm and a step difference of 3 μm to 4 μm may be generated under the organic encapsulation layer 352 disposed in the first area NA1 and the second area NA2. In this case, the auxiliary dam 370a may have a height of 7 μm to 8 μm.

A spacing distance W2 between every two adjacent auxiliary sub-dams of the plurality of auxiliary sub-dams may be designed considering the width of the first area NA1 and the number of auxiliary sub-dams. The spacing distance W2 between every two adjacent auxiliary sub-dams of the plurality of auxiliary sub-dams may be equal to the spacing distance W1 between every two adjacent sub-dams of the plurality of sub-dams of the dam 370. For example, the spacing distance W2 every two adjacent auxiliary sub-dams of between the plurality of auxiliary sub-dams may be from 80 μm to 170 μm.

The width of each of the plurality of auxiliary sub-dams may be designed considering the width of the second area NA2 and the number of auxiliary sub-dams, and may be equal to the width of each of the sub-dams of the dam 370.

The auxiliary dam 370a may be made of a material having a sufficient modulus to effectively control the flowability of the organic encapsulation layer 352 from a lower side of the organic encapsulation layer 352. For example, the auxiliary dam 370a may be made of a material having a modulus of 3 GPa to 4 GPa.

The auxiliary dam 370a may be made of the same material as the dam 370, and may be formed simultaneously when the dam 370 is formed. For example, the auxiliary dam 370a may be formed by patterning a polymer layer integrally formed on the first inorganic encapsulation layer 151 by the iCVD method. Thus, the auxiliary dam 370a may be formed together with the dam 370 without an additional mask process.

Although FIG. 4 illustrates that each of the dam 370 and the auxiliary dam 370a includes three individual sub-dams, the number of sub-dams of the dam 370 and the number of auxiliary sub-dams of the auxiliary dam 370a are not limited thereto.

The encapsulation unit 350 is disposed on the entire surface of the active area AA. The encapsulation unit 350 includes the first inorganic encapsulation layer 151, the organic encapsulation layer 352, and the second inorganic encapsulation layer 353.

The first inorganic encapsulation layer 151 and the second inorganic encapsulation layer 353 may be made of an inorganic material having transparency.

The organic encapsulation layer 352 is disposed between the first inorganic encapsulation layer 151 and the second inorganic encapsulation layer 353. The organic encapsulation layer 352 may cover particles caused by cracks. The cracks may occur during the process of forming the first inorganic encapsulation layer 151 or the second inorganic encapsulation layer 353.

The organic encapsulation layer 352 may be disposed to overlap the dam 370 and the auxiliary dam 370a, and may fill in between the dam 370 and the auxiliary dam 370a. thus, the organic encapsulation layer 352 may have an uneven lower surface patterned according to the shapes of the dam 370 and the auxiliary dam 370a.

As described above, in the display device 300 according to yet another exemplary embodiment of the present disclosure, the dam 370 is disposed inside the encapsulation unit 350 to overlap the organic encapsulation layer 352. Thus, it is possible to reduce the size of the non-active area NA.

Also, in the display device 300 according to yet another exemplary embodiment of the present disclosure, even if the size of the non-active area NA outside the organic encapsulation layer 352 is reduced, the dam 370 for controlling the shape of the organic encapsulation layer 352 may maintain its width constant. Therefore, the reliability of the encapsulation unit 350 may be maintained.

Further, in the display device 300 according to yet another exemplary embodiment of the present disclosure, the dam 370 disposed inside the organic encapsulation unit 350 is composed of the plurality of sub-dams. Thus, it is possible to improve the surface tension of the organic encapsulation layer 352. Therefore, it is possible to effectively control the flowability of the organic encapsulation layer 352.

Furthermore, in the display device 300 according to yet another exemplary embodiment of the present disclosure, the auxiliary dam 370a is disposed in the first area NA1. Thus, it is possible to improve the display quality of the organic light emitting display device 300. As a difference in thickness of an organic encapsulation layer between a non-active area and an active area increases, the transmittance of light may differ between the non-active area and the active area. That is, if the organic encapsulation layer is disposed to gradually decrease in thickness while forming a slope, light may be refracted, and thus, the display quality of the organic light emitting display device may be degraded. Thus, in the display device 300 according to yet another exemplary embodiment of the present disclosure, the auxiliary dam 370a is disposed under the organic encapsulation layer 352 to improve the surface tension of the organic encapsulation layer 352. Also, the auxiliary dam 370a is disposed in the first area NA1. Thus, the organic encapsulation layer 352 with a more even upper surface may be disposed in the non-active area NA close to the active area AA. Therefore, the auxiliary dam 370a may control the shape of the organic encapsulation layer 352 in the first area NA1 close to the active area AA. Accordingly, it is possible to improve the display quality of the organic light emitting display device 300.

FIG. 5A through FIG. 5E are cross-sectional views for explaining a method of manufacturing a display device according to still another exemplary embodiment of the present disclosure.

Figure 5A:
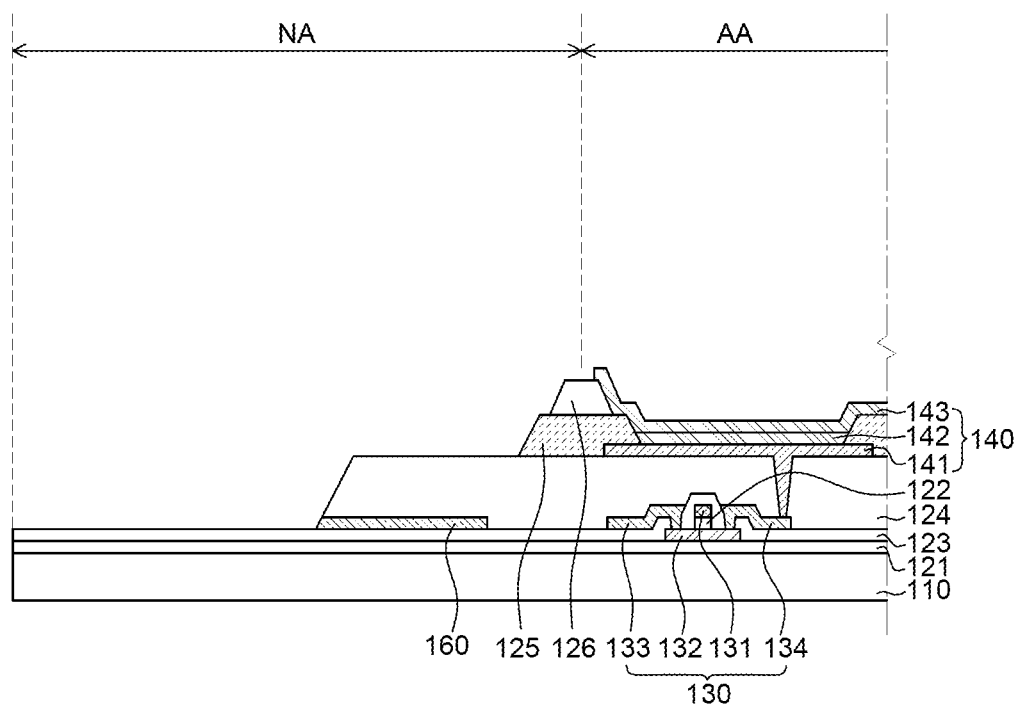
FIG. 5A through FIG. 5E are cross-sectional views for explaining a method of manufacturing a display device according to still another exemplary embodiment of the present disclosure.

FIG. 5A illustrates a cross-sectional view including the organic light emitting diode 140. The buffer layer 121, the interlayer insulating layer 123, the planarization layer 124, the bank layer 125, the spacer 126, and the organic light emitting diode 140 are laminated on the substrate 110. These components have been described above with reference to FIG. 2. Therefore, a repeated description thereof will be omitted.

Figure 5B:
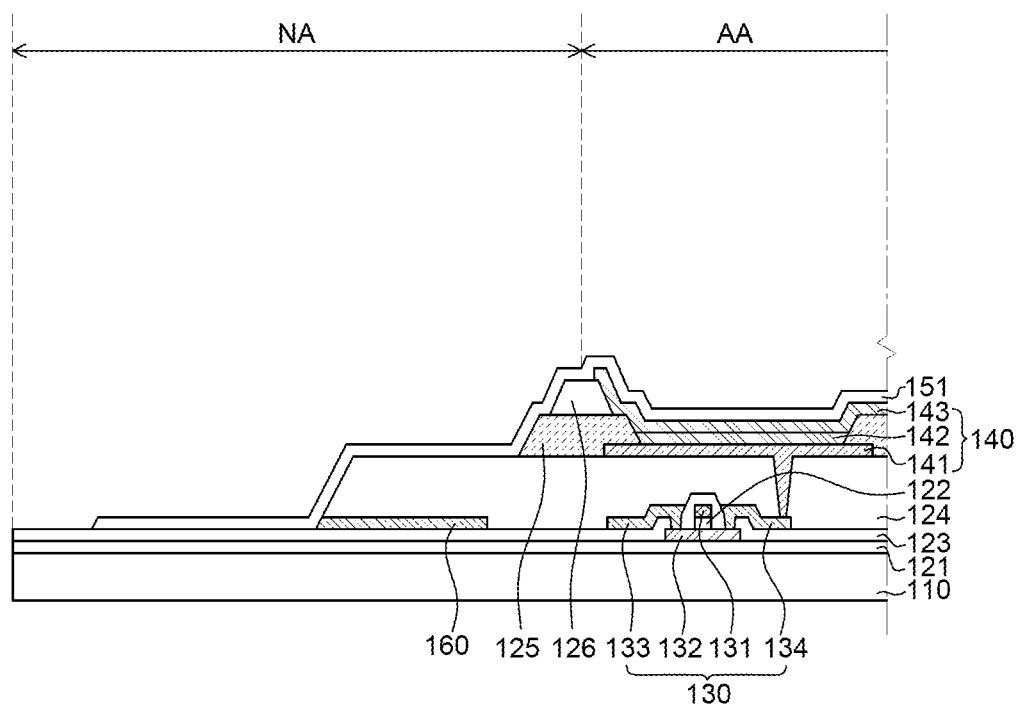

Referring to FIG. 5B, the first inorganic encapsulation layer 151 is deposited to cover the organic light emitting diode 140 and a part of the interlayer insulating layer 123. The first inorganic encapsulation layer 151 may be made of an inorganic insulating material which is capable of being deposited at a low temperature. The inorganic insulating material may include silicon nitride (SiNx), silicon oxide (SiOx), silicon oxide nitride (SiON), or aluminum oxide ($Al_2O_3$). The first inorganic encapsulation layer 151 is disposed to be in contact with an insulating layer disposed on the substrate 110. The first inorganic encapsulation layer 151 may have an uneven upper surface according to the shape of the insulating layer, for example, the organic light emitting diode 140, the interlayer insulating layer 123, the planarization layer 124, and the bank layer 125.

Figure 5C:
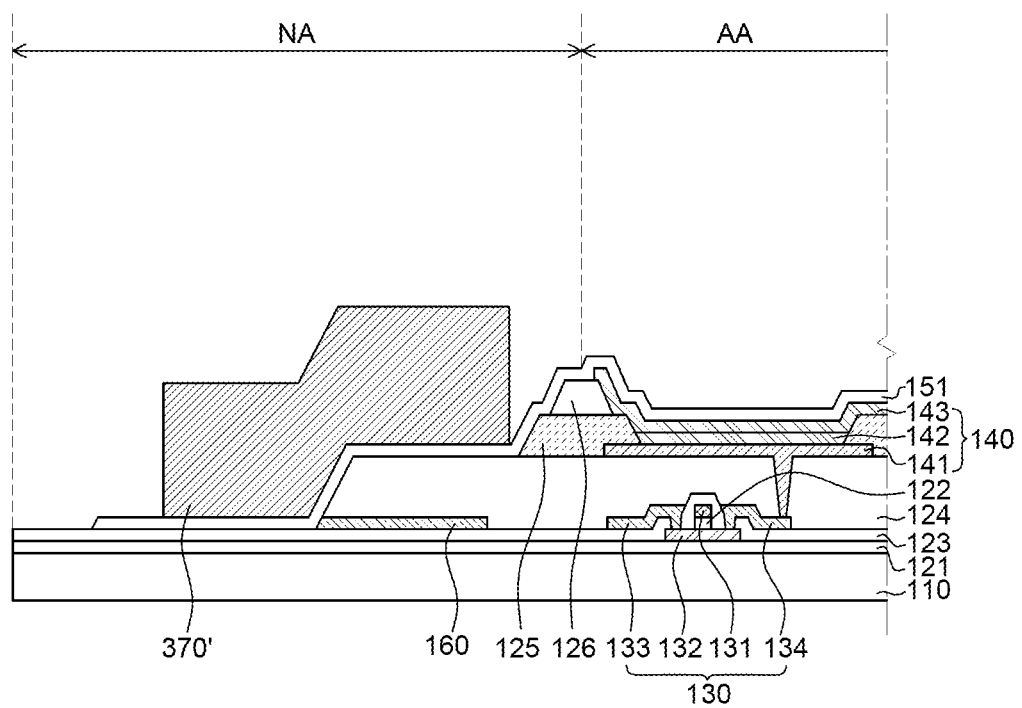

Then, referring to FIG. 5C, a polymer layer 370' is deposited on the first inorganic encapsulation layer 151. The polymer layer 370' may be disposed in the non-active area NA to enclose the active area AA. For example, the polymer layer 370' may be disposed between the outer end of the active area AA and the outer end of the planarization layer 124 and between the outer end of the common voltage line 160 and then outer end of the organic encapsulation layer 152 when viewed from the top.

The polymer layer 370' may be disposed to overlap a part of the insulating layer disposed on the substrate 110. For example, the polymer layer 370' may be disposed to overlap the interlayer insulating layer 123 and the planarization layer 124. Thus, the polymer layer 370' may have an uneven upper surface according to the shape of the upper surface of the first inorganic encapsulation layer 151 disposed on the insulating layer.

The polymer layer 370' may be formed by an initiated chemical vapor deposition (iCVD) process. The iCVD method refers to a process in which free radicals formed by pyrolysis of an initiator that forms radicals at a high temperature activate monomers and then induce consecutive polymerization of neighboring monomers to form an organic polymer film.

For example, the initiator may form radicals by using a filament kept at a higher temperature than the pyrolysis temperature of the initiator. If t-butyl peroxide (TBPO) is used as the initiator, the filament kept at a temperature of 200° C. to 300° C. may induce TBPO to form radicals. Also, the filament may be kept at a temperature at which the monomers are not decomposed. Therefore, the monomers are not pyrolyzed, but may be polymerized and deposited in the form of a thin film on the substrate 110 set to room temperature (10° C. to 40° C.).

A material capable of being activated by the initiator may be used as a monomer. The polymer layer 370' may be made of a copolymer derived from two or more monomers.

The copolymer may be formed by bonding of a monomer having a low modulus and a monomer having a high modulus. The modulus of the copolymer may be regulated by regulating the ratio of the monomers. For example, the monomer having a low modulus may be an acrylate-based compound having a modulus of 10 MPa to 200 MPa, and the monomer having a high modulus may be an acrylate-based compound having a modulus of 4 GPa to 7 GPa. More specifically, the monomer having a low modulus may be 2-ethylhexyl acrylate having a modulus of 30 MPa to 40 MPa or 2-hydroxyethyl acrylate having a modulus of 80 MPa to 90 MPa. Also, the monomer having a high modulus may be glycidyl methacrylate having a modulus of about 6 GPa or benzyl methacrylate having a modulus of 4 GPa to 5 GPa.

The polymer layer 370' may be made of a polymer including a first repeating unit and a second repeating unit. Specifically, the polymer layer 370' may be made of the above-described copolymer. The copolymer may include the first repeating unit derived from the monomer having a low modulus and the second repeating unit derived from the monomer having a high modulus. For example, the polymer layer 370' may be made of EHA-co-GMA including the first repeating unit represented by Chemical Formula 1 derived from 2-ethylhexyl acrylate and the second repeating unit represented by Chemical Formula 2 derived from glycidyl methacrylate. Alternatively, the polymer layer 370' may be made of HEA-co-GMA including a repeating unit represented by Chemical Formula 3 derived from 2-hydroxyethyl acrylate and a repeating unit represented by Chemical Formula 2 derived from glycidyl methacrylate.

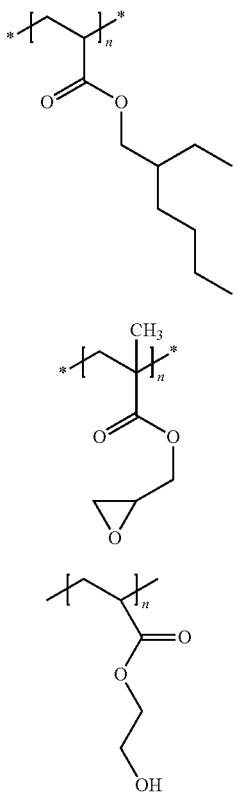

[Chemical Formula 1]

[Chemical Formula 2]

[Chemical Formula 3]

In Chemical Formula 1 to Chemical Formula 3, n is independently an integer of 10 to 1000.

The polymer layer 370' formed by the iCVD method has excellent step coverage. Thus, the polymer layer 370' may be uniformly formed to a constant thickness on an inclined surface and a bottom surface of the first inorganic encapsulation layer 151 disposed thereunder. Particularly, the polymer layer 370' formed by the iCVD method may have a thickness of 10 µm or more. In general, a separate dam or structure needs to be formed to form an organic material layer having a low modulus only in a specific region by a coating method. However, according to the iCVD method, a polymer layer having a thickness of 10 µm or more may be formed only in a partial region of the non-active area without forming a separate dam.

Figure 5D:
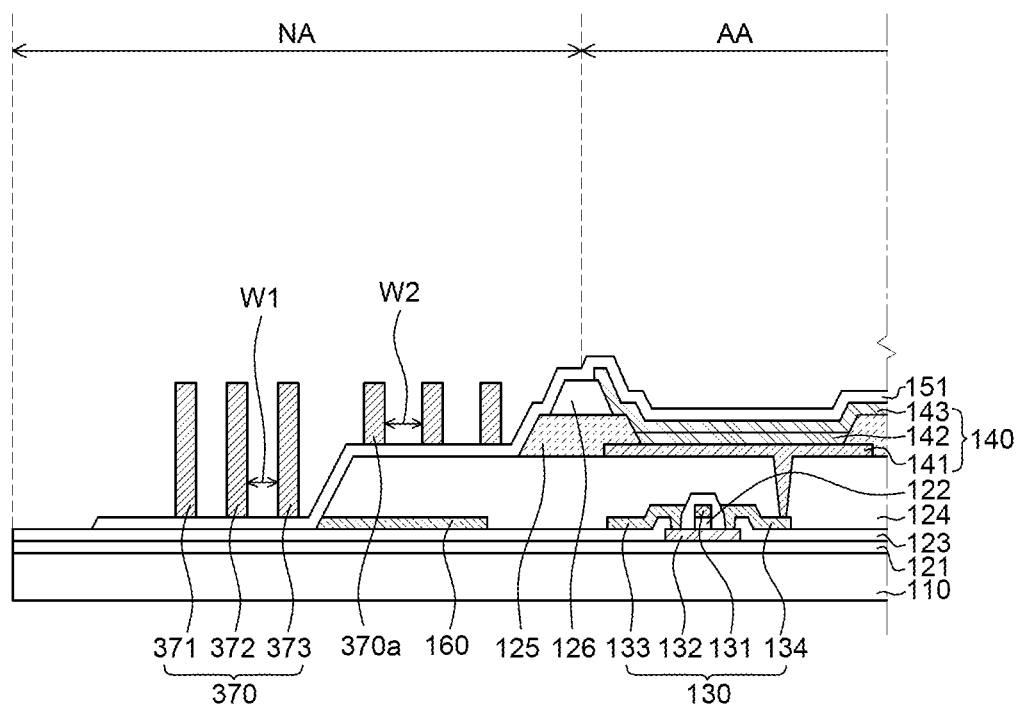

Then, referring to FIG. 5D, a part of the polymer layer 370' is removed. The polymer layer 370' may be removed through a mask process and an etching process.

For example, a part of the polymer layer 370' may be removed so that upper surfaces of the polymer layer 370' are located on the same plane. Thus, a step difference caused by the insulating layer disposed under the polymer layer 370' may be covered.

Also, a part of the polymer layer 370' may be removed so that the insulating layer disposed under the polymer layer 370' is exposed. That is, the polymer layer 370' may be disposed to be separated from the substrate 110 through a patterning process.

As the patterning process of the polymer layer 370' is performed, the dam 370 and the auxiliary dam 370a may be formed. In this case, a distance for patterning of the polymer layer 370' may be equal to the spacing distance W1 of the plurality of sub-dams of the dam 370 and the spacing distance W2 of the plurality of sub-dams of the auxiliary dam 370a. For example, the auxiliary dam 370a may be formed by patterning the polymer layer 370' disposed between the end of the active area AA and the end of the planarization layer 124 when viewed from the top. In this case, a distance for patterning of the auxiliary dam 370a may be equal to the spacing distance W2 of the auxiliary sub-dams. Also, the dam 370 may be formed by patterning the polymer layer 370' disposed between the end of the common voltage line 160 and the end of the organic encapsulation layer 152. In this case, a distance for patterning of the dam 370 may be equal to the spacing distance W1 of the sub-dams of the dam 370.

If the polymer layer 370' is formed by the iCVD method, a polymer thin film deposited by the iCVD method may retain functional groups therein. By using the functional groups, it is possible to enhance the adhesion between the polymer layer 370' and the substrate 110. Thus, it is possible to suppress delamination of the polymer layer 370' from the substrate 110 or damage to the polymer layer 370' when a physical force is applied to the polymer layer 370' during the patterning process. Therefore, it is possible to more stably form the dam 370 and the auxiliary dam 370a.

Figure 5E:
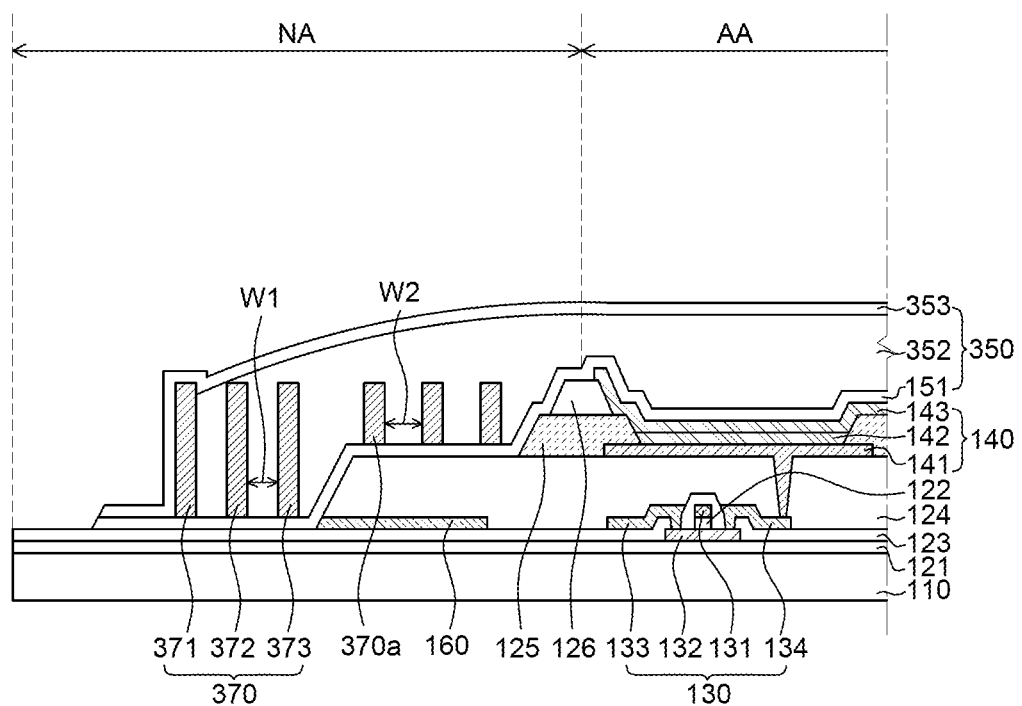

Referring to FIG. 5E, the organic encapsulation layer 352 is disposed inside the dam 370 so as not to flow over the dam 370. The organic encapsulation layer 352 may be made of a material such as an epoxy resin, an acryl resin, silicon oxygen carbon (SiOC), etc. The organic encapsulation layer 352 may be disposed to fill in between upper surfaces of the patterned polymer layer 370', i.e., between the dam 370 and the auxiliary dam 370a. Then, the organic encapsulation layer 352 may be cured by using UV or heat.

finally, the second inorganic encapsulation layer 353 is deposited to cover the organic encapsulation layer 352. The second inorganic encapsulation layer 353 may be made of an inorganic insulating material which is capable of being deposited at a low temperature. The inorganic insulating material may include silicon nitride (SiNx), silicon oxide (SiOx), silicon oxide nitride (SiON), or aluminum oxide ($Al_2O_3$). The second inorganic encapsulation layer 353 may be disposed to overlap the organic encapsulation layer 352, the dam 370, and the auxiliary dam 370a. Also, the second inorganic encapsulation layer 353 may be disposed to be in contact with the first inorganic encapsulation layer 151 disposed outside the dam 370. Thus, the second inorganic encapsulation layer 353 may have an uneven upper surface according to the shape of the organic encapsulation layer 352.

In the display device 300 according to yet another exemplary embodiment of the present disclosure and the method of manufacturing the same, the dam 370 and the auxiliary dam 370a are formed by the iCVD method. Also, the dam 370 and the auxiliary dam 370a are disposed inside the encapsulation unit 350 so as to overlap the organic encapsulation layer 352. Therefore, it is possible to solve the problems occurring in a solution process.

First, an organic encapsulation layer having flowability may be disposed to gradually decrease in thickness while forming a slope. That is, the organic encapsulation layer may increase in thickness as being closer to an active area. Thus, in order to control the flowability of the organic encapsulation layer inside an encapsulation unit, a dam having a greater height than a conventional dam is needed. This is to respond to the increase in thickness of the organic encapsulation layer. If the dam is formed through a solution process, the dam may collapse to the side as the height of the dam increases. Also, a separate structure for controlling the shape of the dam may be needed. In the display device 300 according to yet another exemplary embodiment of the present disclosure and the method of manufacturing the same, the thickness of the polymer layer 370' may be regulated by the iCVD method without a separate structure. Also, the polymer layer 370' may be formed to a thickness of 10 µm or more. Therefore, the dam 370 and the auxiliary dam 370a may be free of design constraints.

The polymer layer 370' formed by the iCVD method has excellent step coverage. Thus, the polymer layer 370' may be uniformly formed to a constant thickness on an inclined surface and a bottom surface of the first inorganic encapsulation layer 151 disposed under the organic encapsulation layer 352. Therefore, the auxiliary dam 370a may be formed simultaneously when the dam 370 is formed. Also, even if there is a step difference under the organic encapsulation layer 352, it is possible to uniformly form the dam 370 and the auxiliary dam 370a.

Organic materials may not be uniformly mixed due to a difference in surface energy. If an insoluble organic material is used as a monomer, the monomer may not be dissolved in an organic solvent. In the display device 300 according to yet another exemplary embodiment of the present disclosure and the method of manufacturing the same, even if monomers that are not uniformly mixed in a liquid phase are used for vapor deposition, a uniform copolymer may be formed. Thus, it is possible to form the uniform polymer layer 370' and also possible to improve the quality of the dam 370 and the auxiliary dam 370a. Also, any organic solvent is not used for dissolving the polymer, and thus, the dam 370 and the auxiliary dam 370a with high purity may be formed without leaving impurities.

Also, the polymer layer 370' may be deposited in a state where the substrate 110 is kept at room temperature. Therefore, it is possible to suppress damage to the substrate 110 and the components disposed on the substrate 110. Accordingly, plastic or a transparent film, which is vulnerable to a high temperature, may be used for the substrate 110.

The exemplary embodiments of the present disclosure can also be described as follows:

According to an aspect of the present disclosure, there is provided an organic light emitting display device. The An organic light emitting display device comprises a substrate including an active area and a non-active area enclosing the active area; a first inorganic encapsulation layer disposed in the active area and at least a part of the non-active area on the substrate; an organic encapsulation layer disposed on the first inorganic encapsulation layer; a second inorganic encapsulation layer disposed on the organic encapsulation layer; and a dam disposed between the first inorganic encapsulation layer and the second inorganic encapsulation layer in the non-active area. At least a part of the organic encapsulation layer is in contact with one surface of the dam.

The first inorganic encapsulation layer extending from an outer side surface of the dam to the outside of the substrate may be in contact with the second inorganic encapsulation layer.

The outer side surface of the dam may be in contact with the second inorganic encapsulation layer.

The dam may have a width of 100 µm to 200 µm.

The dam may be composed of a plurality of dams, and the plurality of dams may be spaced apart from each other at a distance of 80 µm to 170 µm.

Each of the plurality of dams may have a width of 25 µm to 100 µm.

The organic encapsulation layer may fill in between the plurality of dams.

The plurality of dams may increase in height as being closer to an outer side surface of the substrate.

A spacing distance between the plurality of dams may vary.

At least one of the plurality of dams may have a different width from another dam.

The organic light emitting display device may further comprise a common voltage line disposed in the non-active area and configured to supply a voltage to an organic light emitting diode in the active area. The dam may be disposed outside the common voltage line.

The non-active area may include a first area ranging from the active area to an outermost periphery of the common voltage line; a second area ranging from the first area to a contact portion where the first inorganic encapsulation layer and the second inorganic encapsulation layer is contact each other; and a third area ranging from the second area to an outermost periphery of the substrate.

The first area may have a width of 1450 µm to 1650 µm, the second area may have a width of 300 µm to 500 µm, and the third area may have a width of 400 µm to 600 µm.

The dam may be disposed in the second area, and the organic light emitting display device may further include an auxiliary dam disposed between the first inorganic encapsulation layer and the second inorganic encapsulation layer in the first area.

The dam may be made of the same material as the auxiliary dam.

The auxiliary dam may be composed of a plurality of auxiliary dams, and the plurality of auxiliary dams may have the same height.

The dam may have a different height from the auxiliary dam.

The dam may be made of a copolymer including a first repeating unit derived from an acrylate-based compound having a modulus of 10 MPa to 200 MPa and a second repeating unit derived from an acrylate-based compound having a modulus of 4 GPa to 7 GPa.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a substrate including an active area and a non-active area adjacent to the active area;
a first inorganic encapsulation layer disposed in the active area and at least a part of the non-active area on the substrate;
an organic encapsulation layer disposed on the first inorganic encapsulation layer;
a second inorganic encapsulation layer disposed on the organic encapsulation layer; and
a dam disposed between the first inorganic encapsulation layer and the second inorganic encapsulation layer in the non-active area,
wherein at least a part of the organic encapsulation layer is in contact with one surface of the dam, and
wherein the dam is composed of a plurality of sub-dams, and the plurality of sub-dams is spaced apart from each other at a distance between 80 μm and 170 μm including the endpoints.

2. The organic light emitting display device according to claim 1, wherein a part of the first inorganic encapsulation layer extending from an outer side surface of the dam toward the outside of the substrate is in contact with the second inorganic encapsulation layer.

3. The organic light emitting display device according to claim 2, wherein the outer side surface of the dam is in contact with the second inorganic encapsulation layer.

4. The organic light emitting display device according to claim 1, wherein the dam has a width between 100 μm and 200 μm including the endpoints.

5. The organic light emitting display device according to claim 1, wherein each of the plurality of sub-dams has a width between 25 μm and 100 μm including the endpoints.

6. The organic light emitting display device according to claim 1, wherein the organic encapsulation layer fills in between the plurality of sub-dams.

7. The organic light emitting display device according to claim 1, wherein the plurality of sub-dams increases in height as being closer to an outer side surface of the substrate.

8. The organic light emitting display device according to claim 1, a spacing distance between every two adjacent sub-dams of the plurality of sub-dams is different from one another.

9. The organic light emitting display device according to claim 1, wherein at least one of the plurality of sub-dams has a different width from another sub-dam.

10. An organic light emitting display device, comprising:
a substrate including an active area and a non-active area adjacent to the active area;
a first inorganic encapsulation layer disposed in the active area and at least a part of the non-active area on the substrate;
an organic encapsulation layer disposed on the first inorganic encapsulation layer;
a second inorganic encapsulation layer disposed on the organic encapsulation layer; and
a dam disposed between the first inorganic encapsulation layer and the second inorganic encapsulation layer in the non-active area,
a common voltage line disposed in the non-active area and configured to supply a voltage to an organic light emitting diode in the active area,
wherein at least a part of the organic encapsulation layer is in contact with one surface of the dam,
wherein the dam is disposed outside the common voltage line.

11. The organic light emitting display device according to claim 10, wherein the non-active area includes:
a first area ranging from the active area to an outermost periphery of the common voltage line;
a second area ranging from the first area to a contact portion where the first inorganic encapsulation layer and the second inorganic encapsulation layer is contact each other; and
a third area ranging from the second area to an outermost periphery of the substrate.

12. The organic light emitting display device according to claim 11, wherein the first area has a width between 1450 μm and 1650 μm including the endpoints, the second area has a width between 300 μm and 500 μm including the endpoints, and the third area has a width between 400 μm and 600 μm including the endpoints.

13. The organic light emitting display device according to claim 11, wherein the dam is disposed in the second area, and
the organic light emitting display device further includes:
an auxiliary dam disposed between the first inorganic encapsulation layer and the second inorganic encapsulation layer in the first area.

14. The organic light emitting display device according to claim 13, wherein the dam is made of a same material as the auxiliary dam.

15. The organic light emitting display device according to claim 13, wherein the auxiliary dam is composed of a plurality of auxiliary sub-dams, and the plurality of auxiliary sub-dams has a same height.

16. The organic light emitting display device according to claim 13, wherein the dam has a different height from the auxiliary dam.

17. The organic light emitting display device according to claim 1, wherein the dam is made of a copolymer including a first repeating unit derived from an acrylate-based compound having a modulus between 10 MPa and 200 MPa including the endpoints and a second repeating unit derived from an acrylate-based compound having a modulus between 4 GPa and 7 GPa including the endpoints.

18. The organic light emitting display device according to claim 13, wherein upper surfaces of the dam and the auxiliary dam are disposed in the same plane.

19. The organic light emitting display device according to claim 15, wherein a spacing distance between every two adjacent auxiliary sub-dams of the plurality of auxiliary sub-dams is equal to a spacing distance between every two adjacent sub-dams of the plurality of sub-dams of the dam.

* * * * *